United States Patent
Yagi et al.

(10) Patent No.: US 7,947,520 B2
(45) Date of Patent: May 24, 2011

(54) SEMICONDUCTOR LASER AND METHOD OF MAKING THE SAME

(75) Inventors: Hideki Yagi, Yokohama (JP); Toshio Nomaguchi, Yokohama (JP); Kenji Hiratsuka, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/289,709

(22) Filed: Oct. 31, 2008

(65) Prior Publication Data

US 2009/0141764 A1 Jun. 4, 2009

(30) Foreign Application Priority Data

Nov. 5, 2007 (JP) ................................ P2007-287749

(51) Int. Cl.
 *H01L 21/02* (2006.01)
(52) U.S. Cl. ........... 438/39; 438/22; 438/40; 372/45.01; 257/E21.002
(58) Field of Classification Search ...................... 438/22, 438/39, 40; 372/45.01; 257/E21.002
See application file for complete search history.

(56) References Cited

U.S. PATENT DOCUMENTS

| 6,914,009 | B2 * | 7/2005 | Lill et al. | ..................... 438/711 |
| 6,989,550 | B2 | 1/2006 | Nakahara et al. | |
| 2004/0099859 | A1 | 5/2004 | Nakahara et al. | |
| 2004/0175655 | A1 * | 9/2004 | Toyoda et al. | ............. 430/287.1 |
| 2006/0056473 | A1 * | 3/2006 | Tanigawa et al. | .......... 372/43.01 |

FOREIGN PATENT DOCUMENTS

JP 2004-179274 6/2004

* cited by examiner

*Primary Examiner* — Matthew S Smith
*Assistant Examiner* — Christine Enad
(74) *Attorney, Agent, or Firm* — Smith, Gambrell & Russell, LLP

(57) ABSTRACT

In the method of making a semiconductor laser, a semiconductor region is grown on an active layer, and a part of the semiconductor region is etched to form a ridge structure. An insulating film is formed over the ridge structure, and a resin layer of photosensitive material is formed to bury the ridge structure. A cured resin portion and an uncured resin portion are formed in the resin layer by performing lithographic exposure of the resin layer, and the uncured resin portion is on the top of the ridge structure. The uncured resin portion is removed to form a dent which is provided on the top of the ridge structure. An overall surface of the cured resin portion and dent is etched to form an etched resin layer. An opening is formed in the etched resin layer by thinning the cured resin portion, and a part of the insulating film is exposed in the opening of the etched resin layer. The part of the insulating film is etched using the etched resin layer as a mask to form an opening in the insulating film. An electrode is formed over the ridge structure and the etched resin layer.

21 Claims, 6 Drawing Sheets

(a)

(b)

(a)

(b)

(a)

(b)

(a)

(b)

SEMICONDUCTOR LASER AND METHOD OF MAKING THE SAME

BACKGROUND OF THE INVENTION

1. Field of the Invention

The present invention relates to a semiconductor laser device and a method of making the semiconductor laser.

2. Description of the Related Art

Japanese Unexamined Patent Application Publication No. 2004-179274 discloses a ridge waveguide DFB laser having an InGaAlAs active layer. This laser includes a $SiO_2$ protective film having an opening. This opening is formed as follows. After a ridge structure is formed through the etching of a cladding layer and a contact layer on the active layer, a $SiO_2$ protective film is deposited on the surface of the ridge structure, and then the $SiO_2$ protective film is selectively removed by self alignment to form the opening on the ridge structure. An electrode is formed on the ridge structure, and is in contact with the contact layer through this opening.

SUMMARY OF THE INVENTION

When an electrode is formed on the top of the ridge structure on the substrate for the semiconductor laser device, as is disclosed in Japanese Unexamined Patent Application Publication No. 2004-179274, metal cannot be readily deposited on the side face of the ridge structure, so that the resulting metal layer is often uneven. This unevenness causes disconnections of the electrode at steps or edges on the surface of the ridge structure in severe cases. A possible solution to overcome the disconnections involves planarization of an entire surface on which metal is deposited, and the planarization is provided by applying resin, for example, polyimide resin, onto the substrate to embed the ridge structure. After the planarization, the applied polyimide resin layer is etched to form an opening thereof through a resist mask provided on the resin layer, and then an electrode film is formed over the polyimide resin, the opening and the resist mask. By use of the lift-off of the electrode film, an electrode is formed in contact with the ridge structure. Unfortunately, this process requires that the resist on the resin layer should be patterned with high accuracy, and becomes thus complicated.

It is an object of the present invention to provide a semiconductor laser having a structure that can prevent disconnections of an electrode from occurring at the steps or edges in the ridge structure thereof. It is another object of the present invention to provide a method of making the semiconductor laser device, and the method ensures connection between the electrode and the ridge structure with simplified steps.

An aspect of the present invention is a method of making a semiconductor laser. The method includes the following steps: growing a semiconductor region on an active layer; etching a part of the semiconductor region to form a ridge structure; forming an insulating film on a top and a side of the ridge structure; forming a resin layer of photosensitive material to bury the ridge structure and the insulating film; forming a cured resin portion and an uncured resin portion in the resin layer by performing lithographic exposure of the resin layer through a photomask, and the uncured resin portion being provided on the top of the ridge structure; removing the uncured resin portion of the resin layer to form a dent, the dent being provided on the top of the ridge structure; after removing the uncured resin portion, etching an overall surface of the cured resin portion and dent to form an etched resin layer, an opening being formed in the etched resin layer by thinning the cured resin portion, and a part of the insulating film being exposed in the opening of the etched resin layer; etching the part of the insulating film using the etched resin layer as a mask to form an opening in the insulating film; and forming an electrode over the ridge structure and the etched resin layer, the electrode being in contact with the top of the ridge structure through the opening of the etched resin layer.

In the method according to the present invention, the resin layer can be preferably made of photosensitive silicon-based resin. In the method according to the present invention, the resin layer can be preferably made of benzocyclobutene.

In the method according to the present invention, the opening of the insulating film can be preferably self-aligned with the opening of the etched resin layer. Further, in the method according to the present invention, the insulating film can be preferably made of silicon oxide. Furthermore, in the method according to the present invention, the etched resin layer as well as the exposed insulating film can be preferably etched in the step of etching the exposed insulating film using the etched resin layer as a mask to form an opening in the insulating film. In addition, in the method according to the present invention, the insulating film can be etched by etchant including fluorocarbon, and the insulating film can be preferably etched by etchant including $CF_4$.

The method according to the present invention further comprises the step of, before forming a cured resin portion and an uncured resin portion, placing the photomask on the resin layer. Further, the method according to the present invention further comprises the step of, after forming a cured resin portion and an uncured resin portion and before removing the uncured resin portion, separating the photomask from the lithographically-exposed resin layer. Furthermore, the method according to the present invention further comprises a semiconductor substrate on which the active layer is provided. In the method according to the present invention, the part of the insulating film can be preferably located on the top of the ridge structure.

In the method according to the present invention, the top of the ridge structure can be preferably exposed in the opening of the insulating film. In the method according to the present invention, the height of the ridge structure can be preferably larger than a maximum thickness of the etched resin layer. Further, in the method according to the present invention, a pattern of the photomask can be preferably aligned to the top of the ridge structure.

In the method according to the present invention, the etched resin layer includes a first portion and a second portion, the first and second portions are arranged on the active layer, the first portion is adjacent to the ridge structure, the second portion is adjacent to the first portion, and a surface of the first portion is curved to an edge of the opening of the insulating film, and a surface of the second portion is substantially planar.

Another aspect of the present invention is a semiconductor laser device, which comprises: a semiconductor substrate; an active layer provided over the semiconductor substrate; a semiconductor region having a ridge structure and provided on the active layer; an insulating film provided over a top and side of the ridge structure and having an opening at the top of the ridge structure; a resin layer of photosensitive resin provided on the active layer and the side of the ridge structure, and having an opening on the top of the ridge structure; and an electrode provided over the ridge structure and the resin layer and being in contact with the top of the ridge structure through the openings of the insulating film and resin layer. The opening of the insulating film is self-aligned with the opening of the resin layer.

In the semiconductor laser according to the present invention, the resin layer is made of photosensitive silicon-based resin. Further, the resin layer is made of benzocyclobutene.

In the semiconductor laser according to the present invention, wherein the insulating film is made of silicon oxide. In the semiconductor laser according to the present invention, the resin layer includes a first portion and a second portion, which are arranged on the active layer. The first portion is adjacent to the ridge structure, and the second portion is adjacent to the first portion. A surface of the first portion is curved to an edge of the opening of the insulating film, whereas a surface of the second portion is substantially planar.

BRIEF DESCRIPTION OF THE DRAWINGS

The above-described object and other objects, features, and advantages of the present invention will be more easily understood from the following detailed descriptions about preferred embodiments of the present invention with reference to the accompanying drawings.

DETAILED DESCRIPTION OF THE PREFERRED EMBODIMENTS

The teaching of the present invention will be readily understood through the following detailed description with reference to the accompanied drawings shown as examples. Embodiments of a semiconductor laser and a method of making the semiconductor laser will now be described with reference to the attached drawings. When possible, parts identical to each other will be referred to with symbols identical to each other.

Figure 1:
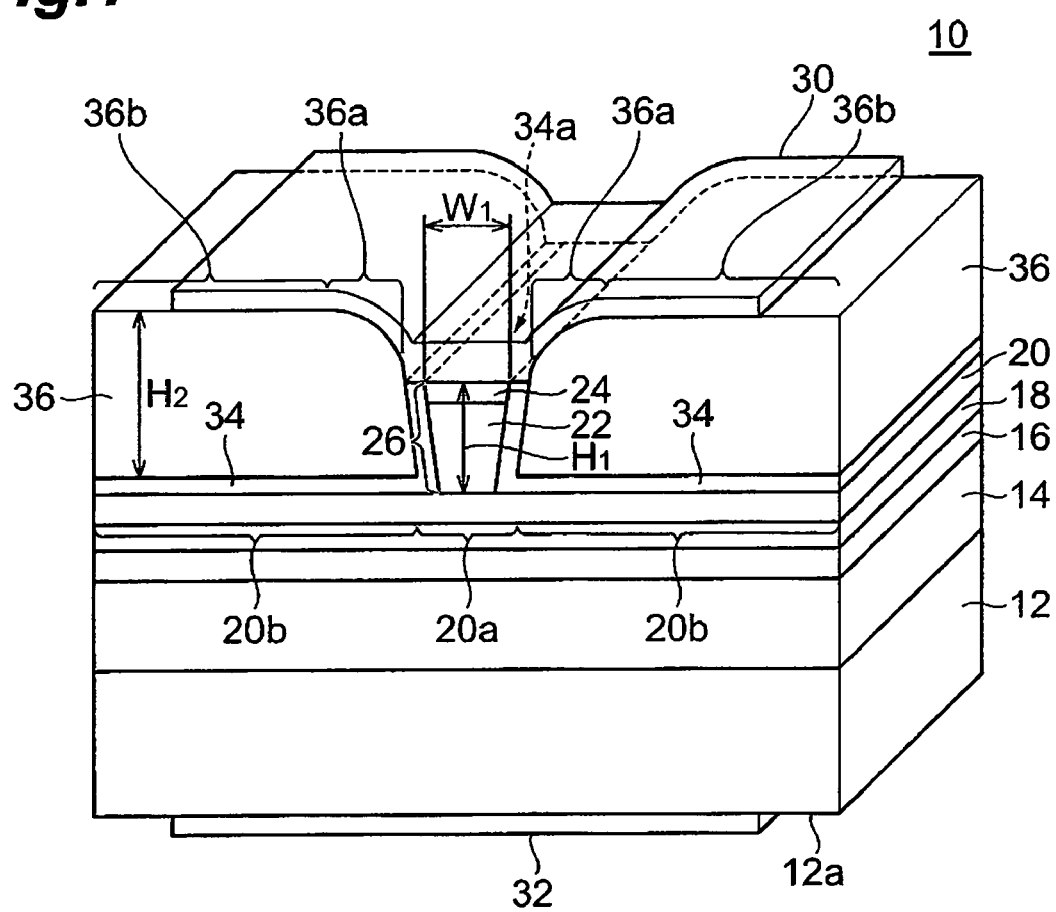
FIG. 1 is a cross-sectional perspective view schematically illustrating the structure of a semiconductor laser according to an embodiment according to the present invention.

FIG. 1 is a cross-sectional perspective view schematically illustrating the structure of a semiconductor laser according to an embodiment of the present invention. The semiconductor laser 10 includes a semiconductor substrate 12; an active layer 18; a first cladding layer 14; and a second cladding layer 22. The semiconductor substrate 12 is composed of a group III-V compound semiconductor of a first conductivity type (e.g. n-type). The active layer 18 is composed of a group III-V compound semiconductor provided above the semiconductor substrate 12. The first cladding layer 14 is composed of a group III-V compound semiconductor of a first conductivity type, and is provided between the semiconductor substrate 12 and the active layer 18. The second cladding layer 22 is composed of a group III-V compound semiconductor of a second conductivity type (e.g. p-type) provided above the active layer 18. In a preferred example, the semiconductor substrate 12 encompasses an InP substrate and a GaAs substrate. When the semiconductor substrate 12 is made of InP, the first and second cladding layers 14 and 22 are preferably composed of, for example, InP. When the semiconductor substrate 12 is made of GaAs, the first and second cladding layers 14 and 22 are preferably composed of, for example, GaInP. The first and second cladding layers 14 and 22 have a thickness of, for example, 2.0 μm.

On the second cladding layer 22, a contact layer 24 is provided. The contact layer 24 is composed of a group III-V compound semiconductor of a second conductivity type. When the semiconductor substrate 12 is made of InP, the contact layer 24 is preferably composed of, for example, GaInAs. When the semiconductor substrate 12 is made of GaAs, the contact layer 24 is preferably composed of, for example, GaAs. The contact layer 24 has a thickness of, for example, 500 nm. In this embodiment, the second cladding layer 22 and the contact layer 24 constitute a semiconductor region provided above the active layer 18. The second cladding layer 22 and the contact layer 24 have a ridge structure 26 extending in a predetermined direction parallel to the primary surface of the semiconductor substrate 12. In a preferred embodiment, the second cladding layer 22 and the contact layer 24 is formed in the shape of a strip, and these layers extend in a predetermined direction parallel to the primary surface of the semiconductor substrate 12 to form the ridge structure 26. The width $W_1$ of the ridge structure 26 is, for example, 1.5 μm in the direction perpendicular to the predetermined direction.

An optical confinement layer 16 is provided between the first cladding layer 14 and the active layer 18, and is composed of a group III-V compound semiconductor. Another optical confinement layer 20 is provided between the active layer 18 and the second cladding layer 22, and is composed of a group III-V compound semiconductor. When the semiconductor substrate 12 is made of InP semiconductor, the optical confinement layers 16 and 20 are preferably composed of, for example, GaInAsP or AlGaInAs. When the semiconductor substrate 12 is made of GaAs semiconductor, the optical confinement layers 16 and 20 are preferably composed of, for example, GaInNAs. The optical confinement layers 16 and 20 have a thickness of, for example, 80 nm.

The active layer 18 has a multiple quantum well structure including barrier layers and well layers, which are alternately deposited. The well layers have a thickness of, for example, 5 nm, and the barrier layers have a thickness of, for example, 8 nm. The number of these layers is, for example, ten. The active layer may have another structure, for example, a single-quantum well structure including one well layer interposed between two barrier layers. Alternatively, the active layer may have a quantum wire structure or a quantum dot structure, and may be composed of a single semiconductor layer. When the emission wavelength of the semiconductor laser 10 can be used for an optical communication wavelength band of 1.3 μm to 1.5 μm, the active layer 18 is preferably composed of, for example, GaInAsP or AlGaInAs for an semiconductor substrate of InP, or is preferably composed of, for example, a GaInNAs or InAs quantum dot for a semiconductor substrate of GaAs.

The optical confinement layer 20 has a first portion 20a and a second portion 20b, and the ridge structure 26 is provided on the first portion 20a. An insulating film 34 is provided over the second portion 20b of the optical confinement layer 20 and the surface of the ridge structure 26. The insulating film 34 is composed of an insulating material, such as silicon oxide ($SiO_2$). The insulating film 34 has an opening 34a at the top of the ridge structure 26, and extends in the longitudinal direction of the ridge structure 26. The opening 34a is formed in the shape of a stripe. The insulating film 34 has a thickness of, for example 300 nm. An electrode 30 is provided on the ridge structure 26. The electrode 30 is in ohmic contact with the contact layer 24 through the opening 34a of the insulating film 34. Another electrode 32 is provided on the back surface 12a of the semiconductor substrate 12.

The resin layer 36 is provided so as to cover both sides of the ridge structure 26 above the semiconductor substrate 12 to planarize the surface of the semiconductor laser 10. The resin layer 36 has a thickness, $H_1$, that is greater than the height, $H_2$, of the ridge structure 26. For example, the thickness of the resin layer 36 is greater than the total thickness of the second cladding layer 22 and contact layer 24. The thickness of the resin layer 36 is, for example, 3.0 μm. The resin layer 36 is composed of a photosensitive resin, for example a silicon-based resin, and the photosensitive resin may be negative resin. Benzocyclobutene (hereinafter referred to as "BCB") resin can be preferably used for the photosensitive resin. Since the BCB resin has a refractive index that enables a large refractive index difference with reference to that of the semiconductor region, the BCB resin constituting the resin layer 36 is preferred in view of optical confinement of propagating light into the ridge structure 26 and its vicinity. In the step described below, the opening 34a of the insulating film 34 is formed by dry etching using $CF_4$ gas by the use of the difference in thickness between the resin layer 36 and the insulating film 34. The electrode 30 is provided on the ridge structure 26 and the resin layer 36, and is connected to the ridge structure 26 through opening 34a. The resin layer 36 includes a first portion 36a and a second portion 36b, which are arranged on the active layer 18. The first portion 36a is adjacent to the ridge structure 26, whereas the second portion 36b is adjacent to the first portion 36a. The surface of the first portion 36a is convexly curved to an edge of the opening 34a of the insulating film 34, and the surface of the second portion 36b is substantially planar.

FIGS. 2 to 6 are schematic cross-sectional views that illustrate steps in a method of making the semiconductor laser 10 according to a preferred embodiment.

(Deposition Step)

Figure 2:
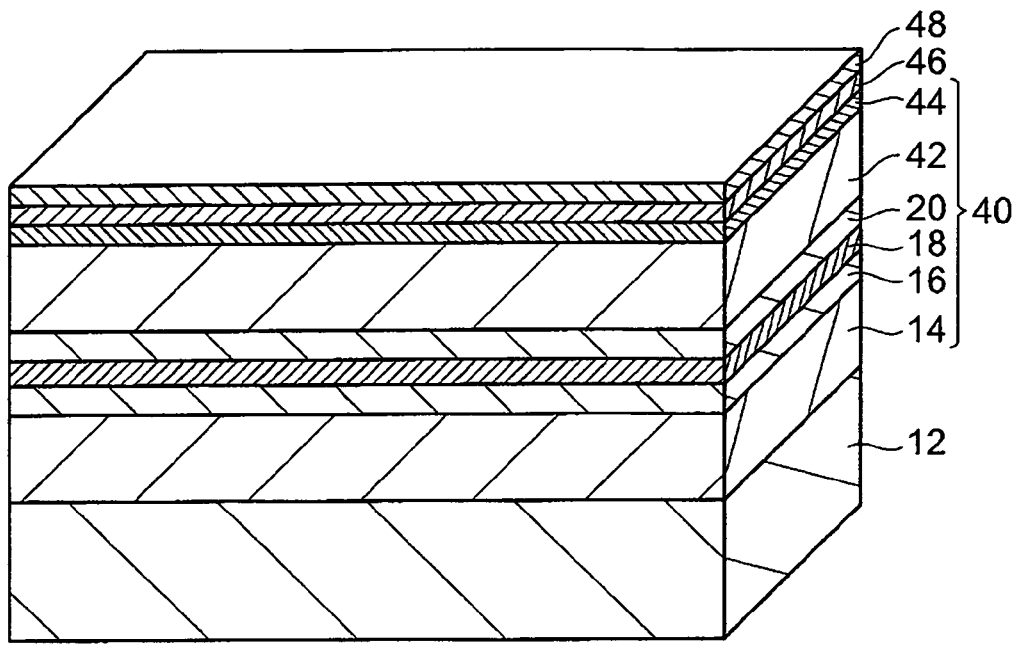
FIG. 2 illustrates a deposition step and the first half of a ridge forming step according to the present embodiment.
Figure 2:
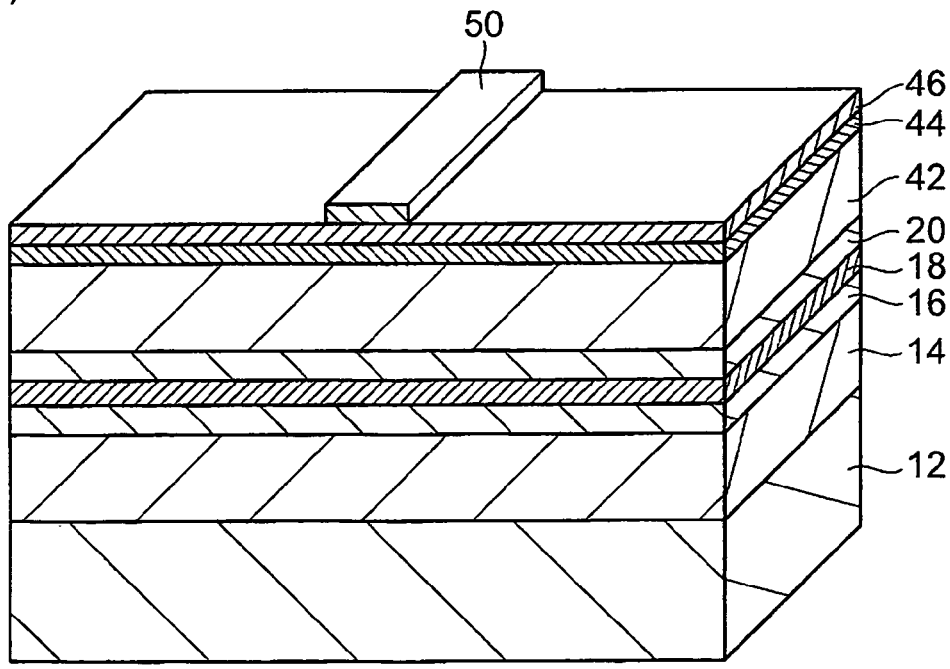
Figure 3:
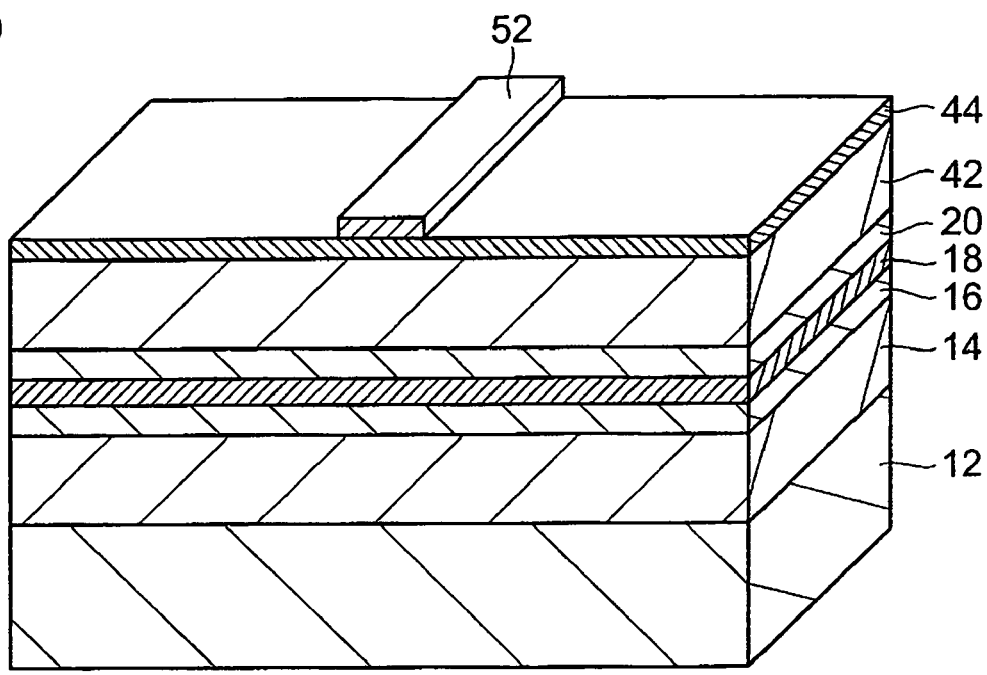
FIG. 3 illustrates the second half of the ridge forming step in the method according to the present embodiment.
Figure 3:
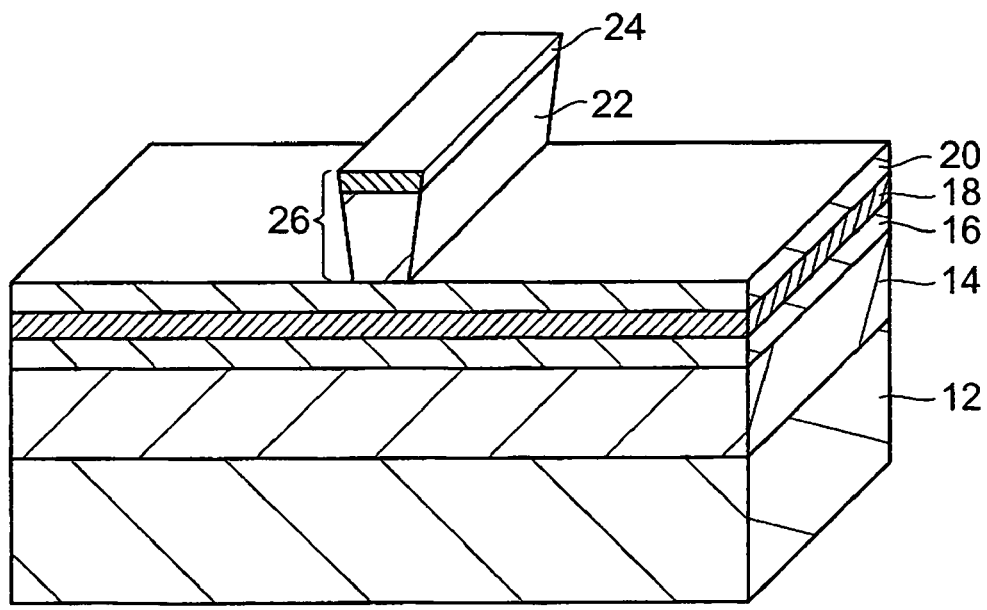

With reference to Part (a) of FIG. 2, a structure 40 including a number of layers is formed on the semiconductor substrate 12. The layered structure 40 includes an active layer 18 and semiconductor layers 42 and 44, which are provided above the active layer 18. In detail, the following layers are arranged over the semiconductor substrate 12: a first cladding layer 14; a optical confinement layer 16; a multiple quantum well active layer 18; a optical confinement layer 20; a group III-V compound semiconductor layer 42 of a second conductivity type functioning as a second cladding layer; and a group III-V compound semiconductor layer 44 of a second conductivity type functioning as a contact layer. If not required, the first cladding layer 14, the optical confinement layer 16, and the optical confinement layer 20 can be used as above. These semiconductor layers can be formed by vapor phase deposition, for example, organometallic vapor phase epitaxy (OM-VPE).

(Ridge-Forming Step)

Next, the group III-V compound semiconductor layers 42 and 44 are etched to form a ridge structure. An insulating film 46 of, for example, $SiO_2$ or SiN is deposited by CVD over the group III-V compound semiconductor layer 44. The insulating film has a thickness of, for example, 200 nm. Resist is applied onto the insulating film to form a resist film 48 over the insulating film, and the resist film 48 is patterned by electron beam exposure. The exposed resist film 48 is developed to form a resist mask 50 with a strip pattern, shown in Part (b) of FIG. 2, and the insulating film 46 is dry-etched through the resist mask 50 with $CF_4$ gas to form a strip etching mask 52 from the resin film 46, as shown in Part (a) of FIG. 3.

Next, the group III-V compound semiconductor layers 42 and 44 are dry-etched through the etching mask 52 to remove parts of the group III-V compound semiconductor layers 42 and 44. After that, the etching mask 52 is removed with buffered hydrofluoric acid (BHF) to obtain a ridge structure 26, as shown in Part (b) of FIG. 3, and the ridge structure 26 includes a second cladding layer 22 and a contact layer 24. Preferably, the group III-V compound semiconductor layers 42 and 44 are dry-etched by reactive ion etching (RIE) using plasma. After the dry etching, it is preferable that the damaged layer due to the dry etching be removed by wet etching.

(Insulating Film Forming Step)

Figure 4:
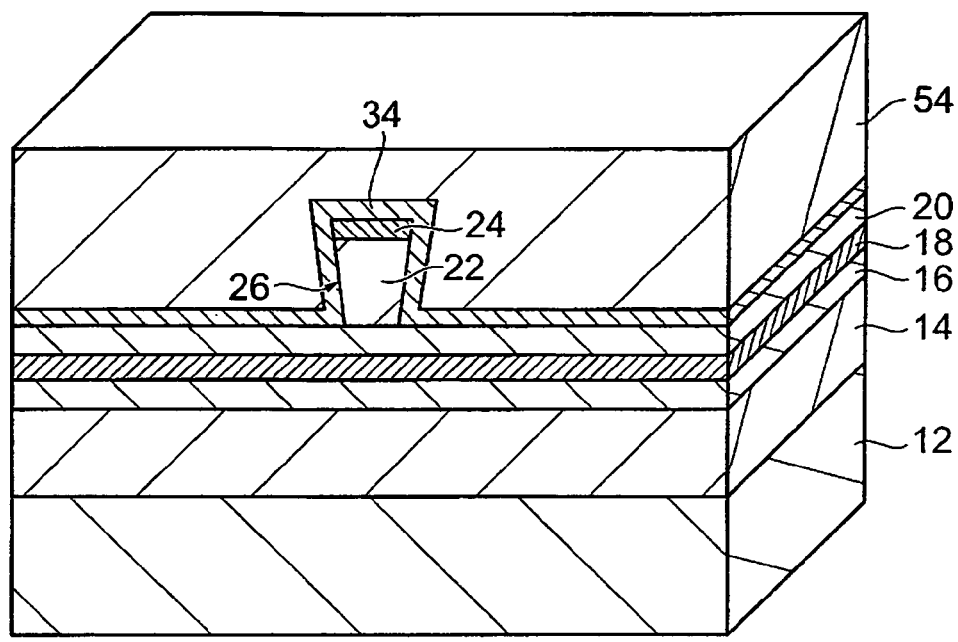
FIG. 4 illustrates a resin-layer forming step and an exposure step according to the present embodiment.
Figure 4:
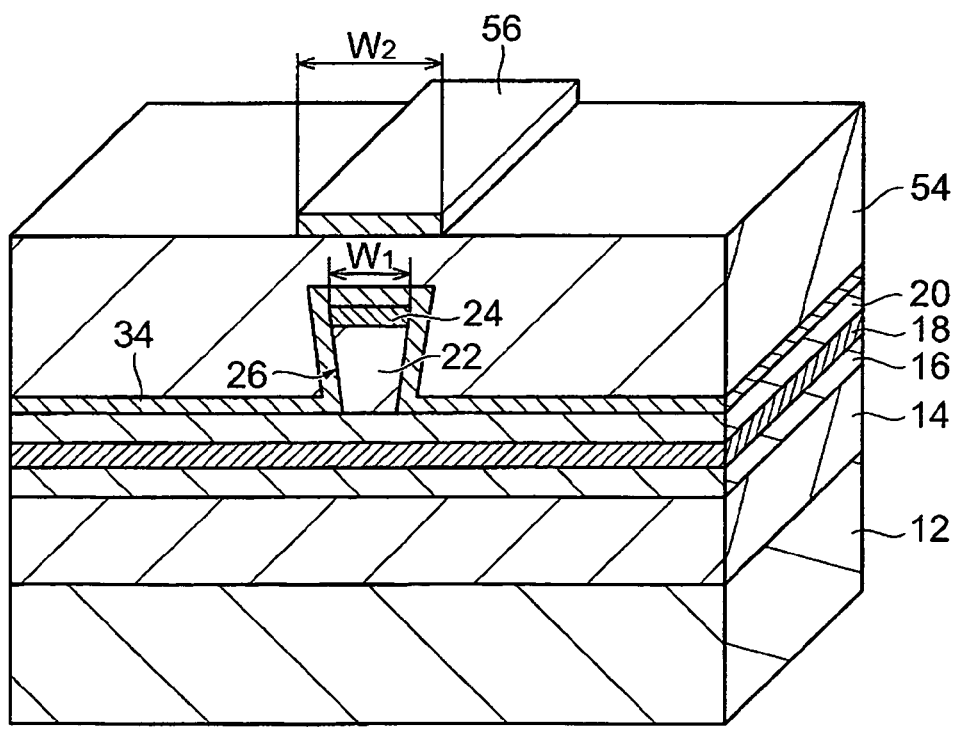

With reference to Part (a) FIG. 4, an insulating film 34, such as $SiO_2$ and SiN, is deposited by, for example, CVD over the ridge structure 26 and the second portion 20b of the optical confinement layer 20.

(Resin Layer Forming Step)

Next, a photosensitive resin layer 54 is formed so as to cover a top and a side of the ridge structure 26. In this step, photosensitive resin, such as a silicon-based resin (preferably a BCB resin), is applied onto the ridge structure 26 and the second portion 20b of the optical confinement layer 20 such that a thickness of the photosensitive resin is greater than the sum of the thickness of the insulating film 34 and the height of the ridge structure 26 (the sum of the thickness of the second cladding layer 22 and the thickness of the contact layer 24). The ridge structure 26 can be completely embedded with the resin layer 54 to planarize the top surface of the device through this step.

(Exposure Step)

The resin layer 54 is exposed and developed. With reference to Part (b) of FIG. 4, after a photomask 56 is prepared, the photomask 56 is placed on the surface of the resin layer 54 of the device, and the pattern of the photomask 56 is aligned to the ridge structure 26. The pattern of the photomask 56 overlaps the top of the ridge structure 26 to cover the whole top of the ridge structure 26. The width $W_2$ of the pattern of the photomask 56 is greater than the width $W_1$ of the ridge structure 26, and for example, the width $W_2$ is greater than the width $W_1$ by about 3 μm, i.e., $W_2-W_1$ is approximately equal to 3 μm. The width $W_2$ is defined in the direction perpendicular to the longitudinal direction of the photomask 56. The photomask 56 is aligned with the ridge structure 26 in such positional and dimensional accuracy of the photomask 56 that the photomask 56 overlaps the entire top surface the ridge structure 26 on the top surface of the resin layer 54. That is, this accuracy of the alignment does not require that the center of the ridge structure 26 be strictly aligned to the center of the pattern. Next, the resin layer 54 is exposed by photolithography through the photomask 56 to cure the resin layer 54 partly, so that the part of the resin layer 54 that is not covered with the photomask 56 has been cured and the remaining part of the resin layer 54 that is covered by the photomask 56 remains uncured. The resin layer 54 is made of a negative resin, such as BCB resin. Referring to FIG. 4, the backside of the photomask 56 is in contact with the resin layer 54. When the resin layer 54 is exposed with light through the photomask 56, the light is diffracted around the edge of the pattern of the photomask 56. The diffracted light goes round to the portion of the resin layer 54 that is behind the pattern of the photomask 56. Thus, this portion of the resin layer 54 behind the pattern of the photomask 56 is also exposed with the diffracted light. The thick resin layer 54 on the ridge structure enables the sufficient exposure with the diffracted light. In the curing step, the cured resin portion and the uncured resin portion are formed, and the uncured resin portion is located between the cured resin regions of the cured resin portion.

The exposure with the diffracted light forms an extension in each the cured resin region. Accordingly, the width of the uncured resin portion is made smaller than the width $W_2$ of the pattern of the photomask 56 and is made close to the width $W_1$. When the insulating film 34 is etched to form an opening 34a in the subsequent opening forming step, the width of the opening 34a is smaller than the width $W_2$ and is approximate to the width $W_1$ of the ridge structure 26. When the width of the uncured resin portion is wider than the width as above, excess etching of the resin layer 54 is caused around the ridge structure 26 in the step of etching the resin layer 54, thereby forming steps and depressions in the resin layer 54 around the ridge structure 26. But, the present embodiment can prevent the formation of these steps and depressions. After forming the cured resin portion and the uncured resin portion, the photomask 56 is separated from the lithographically-exposed resin layer 54.

(Resin Layer Processing Step)

Figure 5:
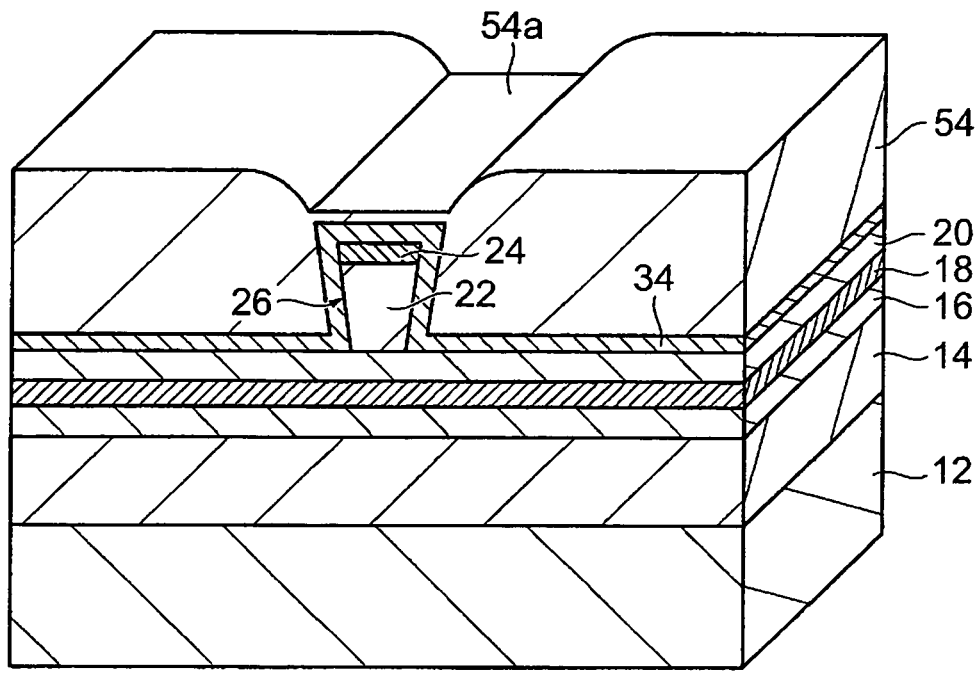
FIG. 5 illustrates a resin-layer processing step in the method according to the present embodiment.
Figure 5:
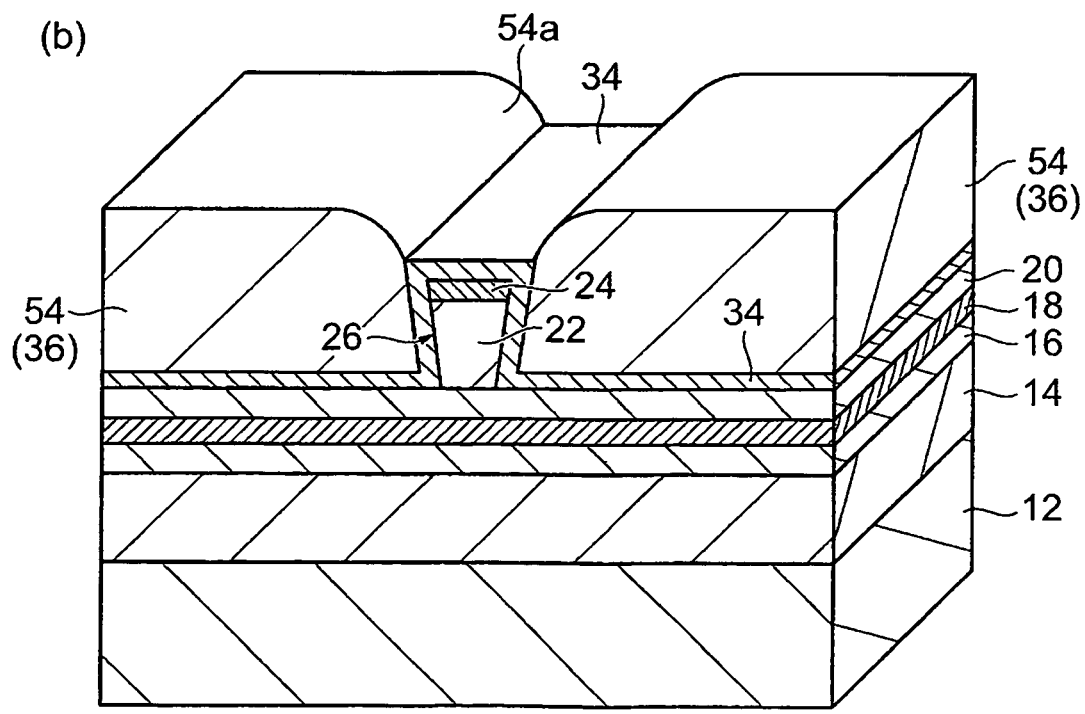

With reference to Part (a) of FIG. 5, the uncured portion of the resin layer 54 is removed by development to form a dent 54a. In a preferred embodiment, the developed resin layer 54 is heat-treated. The entire resin layer 54 is etched by dry etching, for example, using a mixture of fluorocarbon such as $CF_4$ gas and $O_2$ gas. By this etching step, the entire resin layer 54 is thinned in thickness and the insulating film 34 is exposed from the bottom of the dent 54a, as shown in Part (b) of FIG. 5, thereby forming the resin layer 36 from the resin layer 54 shown in FIG. 1.

(Opening Forming Step)

Figure 6:
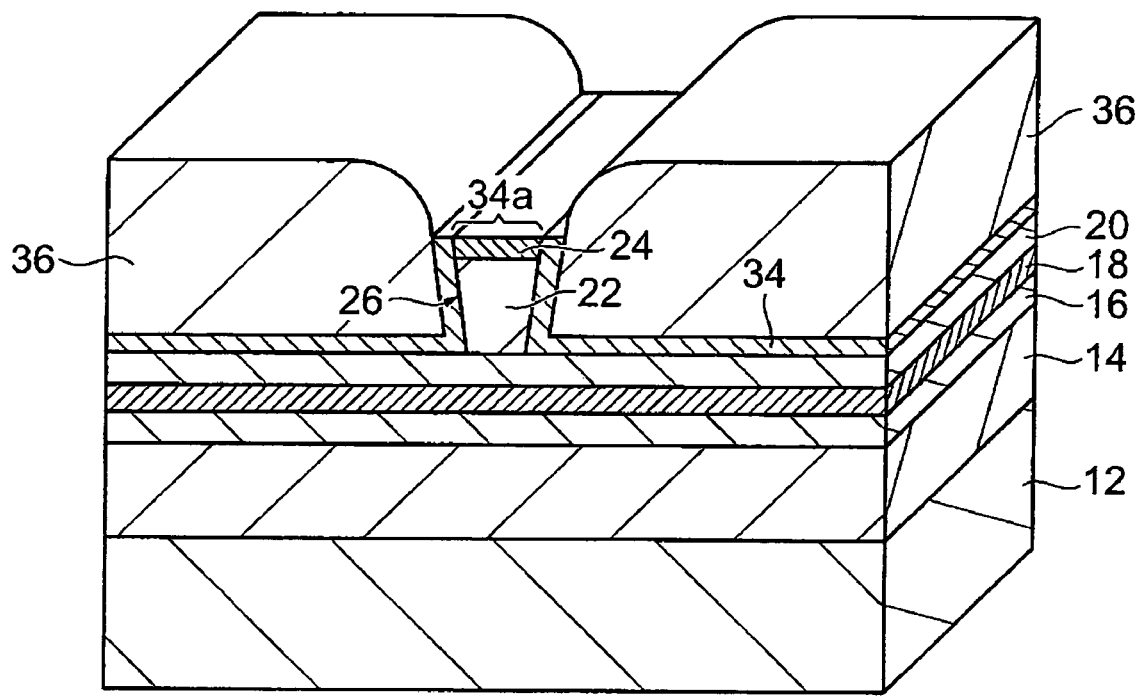
FIG. 6 illustrates an opening forming step in the method according to the present embodiment.

With reference to FIG. 6, the insulating film 34 is etched to form the opening 34a, and in this etching, forming the opening 34a is carried out by the use of a difference in thickness between the resin layer 36 and the insulating film 34. The dry etching is preferably carried out using, for example, $CF_4$ gas. When the resin layer 36 is composed of a BCB resin and an insulating film 34 is composed of $SiO_2$, there is substantially no difference in etching rate between the BCB resin and $SiO_2$ against $CF_4$ gas. Dry etching using $CF_4$ gas therefore can selectively remove the exposed insulating film 34 while the resin layer 36 is left.

(Electrode Forming Step)

Next, an electrode 30 is formed over the ridge structure 26 and the resin layer 36, and as shown in FIG. 1, the electrode 30 is in contact with the contact layer 24 through the opening 34a. Preferably, the electrode 30 is formed as follows: preparing a mask having a electrode pattern by photolithography; depositing a metal layer; and removing a part of the metal layer with the mask while remaining the electrode 30. After grinding the backside of the semiconductor substrate 12, an electrode 32 is formed on the backside of the semiconductor substrate 12, as shown in FIG. 1.

Through these steps, the semiconductor laser 10 can be fabricated. In the method of making the semiconductor laser of this embodiment, the resin layer 54 is formed so as to bury the ridge structure 26, and the resin layer 54 is partially removed to form the dent 54a just above the top of the ridge structure 26. Since the thickness of the resin layer is thin at the dent 54a, etching the entire surface of the relevant resin layer exposes the top of the ridge structure 26 to form the opening 34a, and then the electrode 30 is formed on the resin layer 36 and the exposed top of the ridge structure 26. Such formation of the electrode 30 on the planarized resin layer 54 (layer 36) can effectively prevent disconnection of the electrode 30 at the boundary of the opening 34a.

In the method of making the semiconductor laser of this embodiment, a photosensitive resin is used as a material for forming the resin layer 54 that embeds the ridge structure 26. The exposure of the resin layer 54 is carried out through the photomask 56 aligned with the ridge structure 26, and the uncured portion of the resin layer 54 is removed or developed to form the dent 54a at the top of the insulating film 34. Then, the entire surface of the resin layer 54 is etched to expose the top of the insulating film 34 by thinning the resin layer 54 in thickness. Compared to another process that forms an opening in the resin layer by etching through a resist mask, this embodiment ensures that the insulating film 34 is exposed without high dimensional alignment accuracy of the mask 56. Furthermore, the opening 34a can be readily and surely formed in the insulating film 34 by the use of a difference in thickness between the resin layer 54 and the insulating film 34, in other words, in a self-alignment manner. Accordingly, the method of making the semiconductor laser of this embodiment can prevent disconnection and/or insufficient connection of the electrode 30 and can form connection of the electrode 30 to the ridge structure 26 by use of simplified steps as above. Furthermore, the highly reliable formation of connection between the electrode 30 and the ridge structure 26 improves the production yield of semiconductor lasers.

The semiconductor laser 10 as shown in FIG. 1 has the structure of this embodiment and has the advantageous effects as described above. That is, in the semiconductor laser 10, the surface of the resin layer is convexly curved to a boundary between the ridge structure 26 and the resin layer 36 that covers both sides of the ridge structure 26, and the electrodes 30 extends across the boundary. Since the electrode 30 is provided over the surface planarized by the resin layer 36, this can effectively prevent the disconnection and/or insufficient connection of the electrode 30 around the boundary. Furthermore, in this semiconductor laser 10, the resin layer 36 that buries the ridge structure 26 is composed of a photosensitive resin. In the production process of the semiconductor laser 10, after the photosensitive resin layers 54 are formed so as to cover the top and both sides of the ridge structure 26 as shown in Part (a) of FIG. 4, the exposure of the resin layer 54 via the photomask 56 is carried out as shown in Part (b) of FIG. 4. Then, the uncured portion is removed or developed to form the dent 54a as shown in Part (a) of FIG. 5. The entire resin layer 54 is thinned as shown in Part (b) of FIG. 5. This procedure simplifies fabrication steps, which enables the exposure of the top the insulating film 34 even if the mask 56 is varied in size to lower the dimensional accuracy thereof. Furthermore, the opening 34a of the insulating film 34 can be surely self aligned to the ridge structure 26 by the use of a difference in thickness between the resin layer 54 (layer 36) and the insulating film 34. Accordingly, with the simplified steps as above, the semiconductor laser of this embodiment can reduce disconnections and/or insufficient connections of the electrode 30 due to steps at the boundary and the edges of the resin layer 54 to provide an excellent connection between the electrode 30 and the ridge structure 26. Furthermore, high assuredness of connection between the electrode 30 and the ridge structure 26 improves the production yield of the semiconductor laser 10.

In the semiconductor laser device 10 and the method of making the same in this embodiment, it is preferable that the resin layer 36 (layer 54) be composed of a silicon-based resin. This resin can provide the formation of the photosensitive resin layer 36 (layer 54). In a more preferred embodiment, the resin layer 36 (layer 54) is composed of a BCB resin. Since the BCB resin has higher resistance to high temperatures compared to other resins, such as polyimide, the resin layer 36 can be tolerant of heat that is applied during the formation of the overlying electrode 30. In a more preferred embodiment for the resin layer 36 of silicon-based resin, the insulating film 34 is composed of silicon oxide ($SiO_2$) and the opening 34a of the insulating film 34 is dry-etched using $CF_4$ gas. The combination of silicon-base resin, silicon oxide ($SiO_2$) and $CF_4$ gas does not have a substantial difference in etching rate between the insulating film 34 and the resin layer 36, and can ensure the formation of the opening 34a in the insulating film 34 by the use of the etching of a structure including the insulating film 34 and the resin layer 36 with a large difference in thickness therebetween.

The semiconductor laser and the method of making the same of the present invention is not limited to the embodiment described above, and can include a variety of modifications. For example, an InP substrate and a GaAs substrate as semiconductor substrates, and InP semiconductor and GaAs semiconductor as semiconductor layers deposited thereon are exemplified in the embodiment described above. Other group III-V compound semiconductor material, such as a GaN semiconductor, and other semiconductor material different from the group III-V compound semiconductor material may be preferably used in the semiconductor laser and the method of making the same of the present invention as well.

What is claimed is:

1. A method of making a semiconductor laser, comprising the steps of:
   growing a semiconductor region of an active layer;
   etching a part of the semiconductor region to form a ridge structure;
   forming an insulating film on a top and a side of the ridge structure, the insulating film being made of silicon dioxide;
   forming a single resin layer of photosensitive material to bury the ridge structure and the insulating film, the single resin layer being made of photosensitive silicon-based resin, single resin layer covering the top and the side of the ridge structure, and a thickness of the resin layer being larger than a height of the ridge structure;
   forming a cured resin portion and an uncured portion in the single resin layer by performing lithographic exposure of the single resin layer through a photomask, the photomask having a pattern, a width of the pattern being greater than a width of the top of the ridge structure, the single resin layer being expose with light through the photomask, the light being diffracted around an edge of the pattern of the photomask, the single resin layer having a portion behind the pattern of the photomask, the portion of the single resin layer being exposed with the diffracted light, and the uncured resin portion being provided on the top of the ridge structure;
   removing the uncured resin portion of the single resin layer to form a dent, the dent being provided on the top of the ridge structure;
   after removing the uncured resin portion, etching an overall surface of the cured resin portion and dent by etchant to form an etched resin layer, an opening being formed in the etched resin layer by thinning the cured resin portion, the etchant including $CF_4$ and $O_2$ and a part of the insulating film being exposed in the opening of the etched resin layer;
   etching the part of the insulating film using the etched resin layer as a mask to form an opening in the insulating film, the insulating film being dry etched by etchant including $CF_4$, the etched resin layer including a first portion and a second portion, the first and second portions of the etched resin layer being arranged on the active layer, the first portion of the etched resin layer being adjacent to the ridge structure, the second portion of the etched resin layer being adjacent to the first portion of the etched resin layer, a surface of the first portion of the etched resin layer being convexly curved to an edge of the opening of the insulating film; and
   forming an electrode over the ridge structure and the etched resin layer, the electrode being in contact with the top of the ridge structure through the opening of the etched resin layer, and the electrode being in direct contact with the etched resin layer.

2. The method according to claim 1, wherein the photosensitive silicon-based resin is photosensitive benzocyclobutene.

3. The method according to claim 1, wherein the opening of the insulating film is self-aligned with the opening of the etched resin layer.

4. The method according to claim 1, wherein the etched resin layer as well as the exposed insulating film is etched in the step of etching the exposed insulating film using the etched resin layer as a mask to form the opening in the insulating film.

5. The method of claim 1, wherein the overall surface of the cured resin portion and dent is etched by etchant including a mixture of flourocarbon and $O_2$.

6. The method according to claim 1, the method further comprising the step of, before forming a cured resin portion and an uncured resin portion, placing the photomask on the resin layer.

7. The method according to claim 1, the method further comprising the step of, after forming a cured resin portion and an uncured resin portion and before removing the uncured resin portion, separating the photomask from the lithographically-exposed resin layer.

8. The method according to claim 1, wherein a pattern of the photomask is aligned to the top of the ridge structure.

9. The method according to claim 1, further comprising a semiconductor substrate, the active layer being provided on the semiconductor substrate.

10. The method according to claim 1, wherein the top of the ridge structure is exposed in the opening of the insulating film.

11. The method according to claim 1, wherein the height of the ridge structure is larger than a maximum thickness of the etched resin layer.

12. The method according to claim 1, wherein the etched resin layer includes a first portion and a second portion, the first and second portions are arranged on the active layer, the first portion is adjacent to the ridge structure, the second portion is adjacent to the first portion, and a surface of the firsty portion is curved to an edge of to opening of the insulating film, and a surface of the second portion is substantially planar.

13. The method according to claim 1, wherein the photomask has a pattern, and a width of the pattern is greater than the a width of the top of the ridge structure.

14. The method according to claim 13, wherein the width of the pattern is defined in a direction perpendicular to a logitudinal direction of the photomask.

15. The method according to claim 1, wherein a width W2 of the pattern of the photomask is greater than a width W1 of the top ridge structure, and W2−W1 is approximately equal to 3 μm.

16. The method according to claim 1, wherein the single resin layer is in physical contact with the insulating film located on the whole side of the ridge structure.

17. The method according to claim 1, wherein a backside of the photomask is in contact with the resin layer.

18. The method according to claim 1, wherein semiconductor of ridge has a single conductive type.

19. The method according to claim 1, wherein the ridge structure includes a cladding layer and a contact layer, an optical confinement layer is provided between the semiconductor region and the active layer and has a first portion and a second portion, the ridge structure is located on the first portion, and the single resin layer is in physical contact with the insulating film located on the first portion of the optical confinement layer.

20. The method according to claim 18, wherein the single resin layer is in physical contact with the insulating layer located on the second portion of the optical confinement layer.

21. The method according to claim 1, wherein a surface of the second portion of the etched resin layer is substantially planar.

* * * * *